(12) United States Patent
Lopez Jauregui et al.

(10) Patent No.: US 12,184,258 B2
(45) Date of Patent: Dec. 31, 2024

(54) AUTOMATIC IMPEDANCE MATCHING FOR EMAT

(71) Applicants: Borja Lopez Jauregui, Lynchburg, VA (US); Philip Haywood Cox, Madison Heights, VA (US); Nathaniel Quinn Huggins, Forest, VA (US)

(72) Inventors: Borja Lopez Jauregui, Lynchburg, VA (US); Philip Haywood Cox, Madison Heights, VA (US); Nathaniel Quinn Huggins, Forest, VA (US)

(73) Assignee: Innerspec Technologies, Inc., Forest, VA (US)

( * ) Notice: Subject to any disclaimer, the term of this patent is extended or adjusted under 35 U.S.C. 154(b) by 258 days.

(21) Appl. No.: 17/976,539

(22) Filed: Oct. 28, 2022

(65) Prior Publication Data

US 2024/0146278 A1    May 2, 2024

(51) Int. Cl.
*H03H 7/38*        (2006.01)
*G01N 29/04*       (2006.01)
*G01N 29/24*       (2006.01)

(52) U.S. Cl.
CPC .............. *H03H 7/38* (2013.01); *G01N 29/04* (2013.01); *G01N 29/2412* (2013.01); *G01N 2291/0234* (2013.01)

(58) Field of Classification Search
CPC ........ G01N 29/00; G01N 29/04; G01N 29/14; G01N 29/24; G01N 29/2412; G01N 2291/0234
See application file for complete search history.

(56) References Cited

U.S. PATENT DOCUMENTS

| | | | | |
|---|---|---|---|---|
| 5,048,340 A | * | 9/1991 | Thompson | G01N 29/07 73/602 |
| 5,511,424 A | * | 4/1996 | MacLauchlan | B06B 1/04 73/609 |
| 6,951,133 B2 | * | 10/2005 | Passarelli, Jr. | G01N 29/223 73/622 |

FOREIGN PATENT DOCUMENTS

CN        113848250 A    *  12/2021

OTHER PUBLICATIONS

Machine translation of CN-113848250-A (Year: 2021).*

* cited by examiner

*Primary Examiner* — Nguyen Q. Ha

(57) ABSTRACT

An automatic impedance matching system that reads the input impedance of an electromagnetic acoustic transducer (EMAT) electrical circuit and automatically select appropriate input impedance matching by combining components from a built-in selection of a matching circuitry. A Vector Network Analyzer or similar impedance measuring circuit is connected to the EMAT electrical circuit to measure the input impedance of the EMAT electrical circuit comprising an RF coil, coil cable, and conductive material to be inspected at a given material lift-off, and to relay measurement information to the system processor. The processor uses this information to adjust the overall input impedance of the EMAT electrical circuitry by selecting appropriate components such as capacitors and transformer taps of the built-in selection of the matching circuitry connected between the system pulser/receiver and the coil cable. As such, the overall impedance of the EMAT electrical circuit can be adjusted to best match a desired impedance that would optimize performance of the EMAT which is based on a measured acoustic signal transmission coefficient or a measured acoustic signal reflection coefficient of the EMAT.

(Continued)

The system can work in either pulse-echo (same transmitter and receiver) or pitch-catch (different transmitter and receiver).

5 Claims, 4 Drawing Sheets

AUTOMATIC IMPEDANCE MATCHING FOR EMAT

BACKGROUND OF THE INVENTION

The present invention relates generally to the field of non-destructive testing and in particular to Electromagnetic Acoustic Transducers (EMAT).

An EMAT uses an RF (radio frequency) coil of wire energized with AC voltage and a static magnetic field to generate an ultrasonic vibration in an adjacent metallic component. This RF coil of wire acts as an inductor that stores energy in magnetic form that generates an opposing magnetic field in the metallic component. When the generated electromagnetic field on the component interacts with the static magnetic field, the vectorial resultant is a mechanical force in the material of the metallic component in the form of an ultrasonic wave.

In order to build an effective EMAT, the designer needs to take into account the geometry of the RF coil to be able to generate a wave with the desired wavelength, dimensions and shape as well as the characteristics of the EMAT electrical circuit to optimize the amount of energy induced into the metallic component.

One of the challenges in EMAT design is that in addition to the RF coil and the coil cable, the component's material composition and structure and its distance to the RF coil—commonly referred as material lift-off—also affect the inductance of the RF coil and as such are part of the EMAT electrical circuit. To compensate for different RF coils, cables, material, and material lift-off, EMAT circuits are typically joined with transformers and/or capacitors in order to match the input impedance of the load (coil) to an optimal impedance for the source (e.g., pulser instrument) so as to maximize power transfer from the source to the metallic component and to minimize reflections within the EMAT electrical circuit.

Most EMAT systems are often designed for a specific application with fixed impedance matching and will require physically changing circuits to adapt to any change in the EMAT electrical circuit. If physically changing matching components is not possible, the matching is normally a compromise that can work with different EMAT electrical circuits.

This invention relates to a system that can automatically measure the impedance of any EMAT electrical circuit and select the appropriate matching by combining components from a selection of built-in tuning options designed specifically for EMAT coils.

SUMMARY OF THE INVENTION

In one aspect of the present invention, a Vector Network Analyzer (VNA) or similar device is used to find the impedance of an EMAT electrical circuit which includes the coil cable, RF coil, material, and lift-off from the material to the coil. The VNA circuit can be connected to the system and send the measured impedance to a processor that will automatically select the appropriate combination of transformer and capacitor values from a second circuit so as to provide the appropriate matching combination.

The matching circuitry includes a multi-tap transformer and selectable capacitors of sufficient values to satisfy the required impedance matching conditions. A set of switches controlled by the processor will select the appropriate transformer taps and capacitor values to properly match the measured input impedance of the EMAT circuit to the desired input impedance.

DETAILED DESCRIPTION OF THE INVENTION

The following detailed description is of the best currently contemplated modes of carrying out exemplary embodiments of the invention. The description is not to be taken in a limiting sense, but is made merely for the purpose of illustrating the general principles of the invention, since the scope of the invention is best defined by the appended claims. The present invention relates to an automatic impedance measurement and impedance matching system to be used with Electromagnetic Acoustic Transducers (EMAT).

An EMAT uses a coil of wire energized with AC voltage and a static magnetic field to generate ultrasonic vibrations in an adjacent metallic component. The coil of wire acts as an inductor that stores energy in magnetic form that generates an opposing magnetic field in a metallic component. When the field on the metallic component interacts with the static magnetic field, the vectorial resultant is a mechanical force in the material in the form of an ultrasonic wave.

Since the ultrasound is electromagnetically induced into the material, the complete EMAT electrical circuit is matched with the pulser/receiver to optimize performance of the EMAT. The EMAT electrical circuit includes the RF coil (sensor) cable, the RF coil, the material being inspected, and the material lift-off. The distance from the material to the coil (material lift-off) is relevant since it will affect the amount of energy that is electromagnetically coupled into the part and thus the inductance of the coil itself.

This disclosure refers to a system comprising an electronic circuit that measures the impedance of the EMAT electrical circuit, an impedance matching circuit with capacitors and transformers and/or inductors that can be selectively combined to adjust the overall input impedance of the EMAT electrical circuit as needed to a desired input impedance that would optimize performance of the source (pulser/receiver instrument) therefore the EMAT itself, and a processor that controls and manages the complete process.

Figure 1:
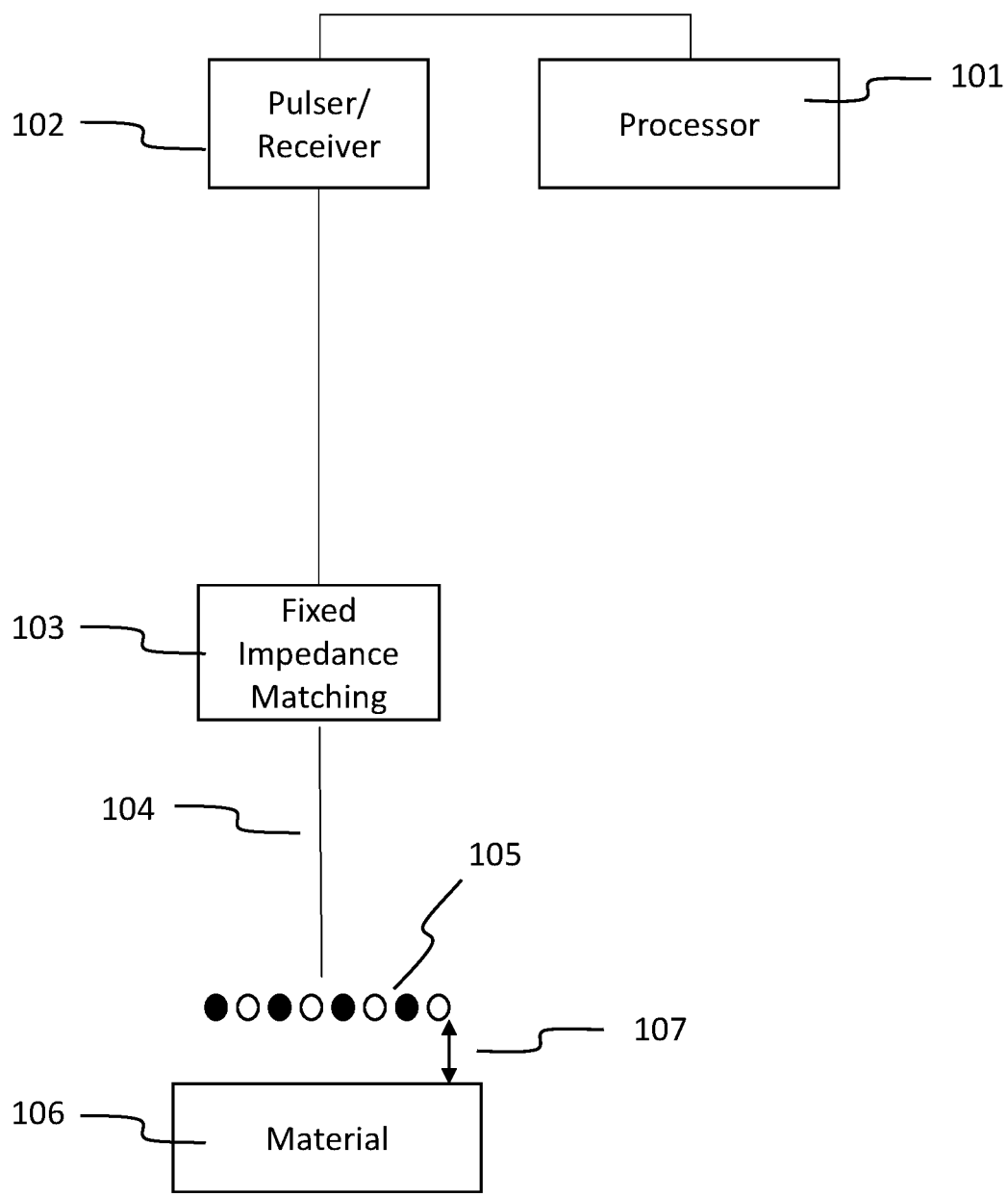
FIG. 1 is an illustration of a standard EMAT electrical circuit including the processor, pulser-receiver, fixed impedance matching circuit, RF coil cable, RF coil, and the material at a given lift-off from the coil.

FIG. 1 shows a standard EMAT including the system processor 101, which controls the pulser/receiver 102 that is connected to the RF coil 105 after a fixed impedance matching circuit 103 through a coil cable 104. The RF coil induces a current in the material to be inspected 106. The electromagnetic characteristics of the material as well as the material lift-off 107 will affect the amount of energy induced in the material.

Figure 2:
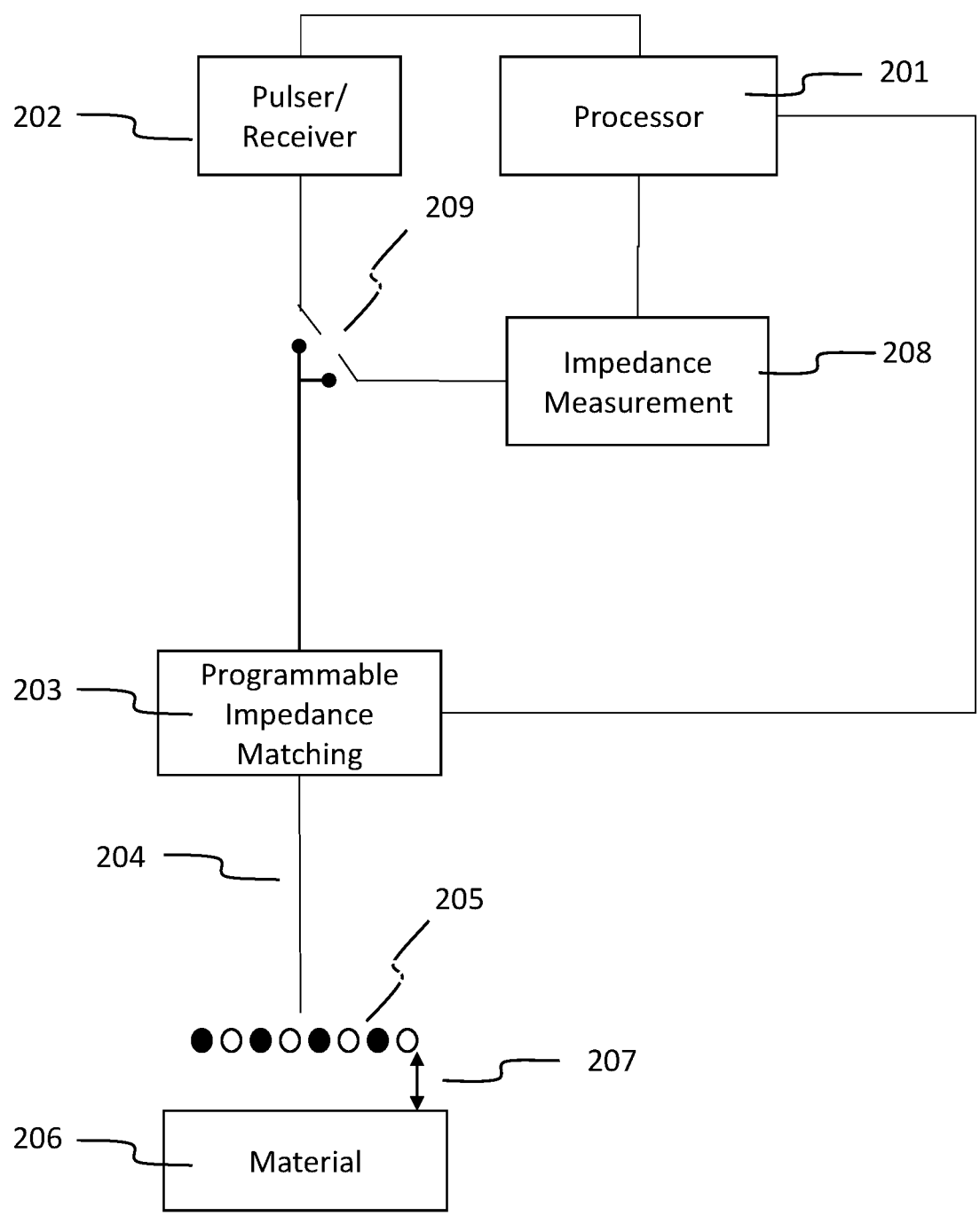
FIG. 2 is an illustration showing an EMAT electrical circuit including the additional circuitry proposed in the patent which includes the impedance measurement and the programmable impedance matching which substitutes the fixed matching circuit.

FIG. 2 shows a schematic of the novel design. The system's processor 201 controls the pulser/receiver 202 that is connected to the RF coil 205 after a programmable matching circuit 203 through a coil cable 204. The system also includes an impedance measurement circuit 208 that can be connected to the EMAT electrical circuit using switches 209 controlled by the processor. The circuit measures and sends to the processor the combined impedance of the specific RF coil, coil cable, material, and material lift-off 207. This information is relayed to the processor which can modify the measured impedance by combining components (capacitors, transformers, and/or inductors) in the impedance matching circuit through the programmable matching circuit.

Figure 3:
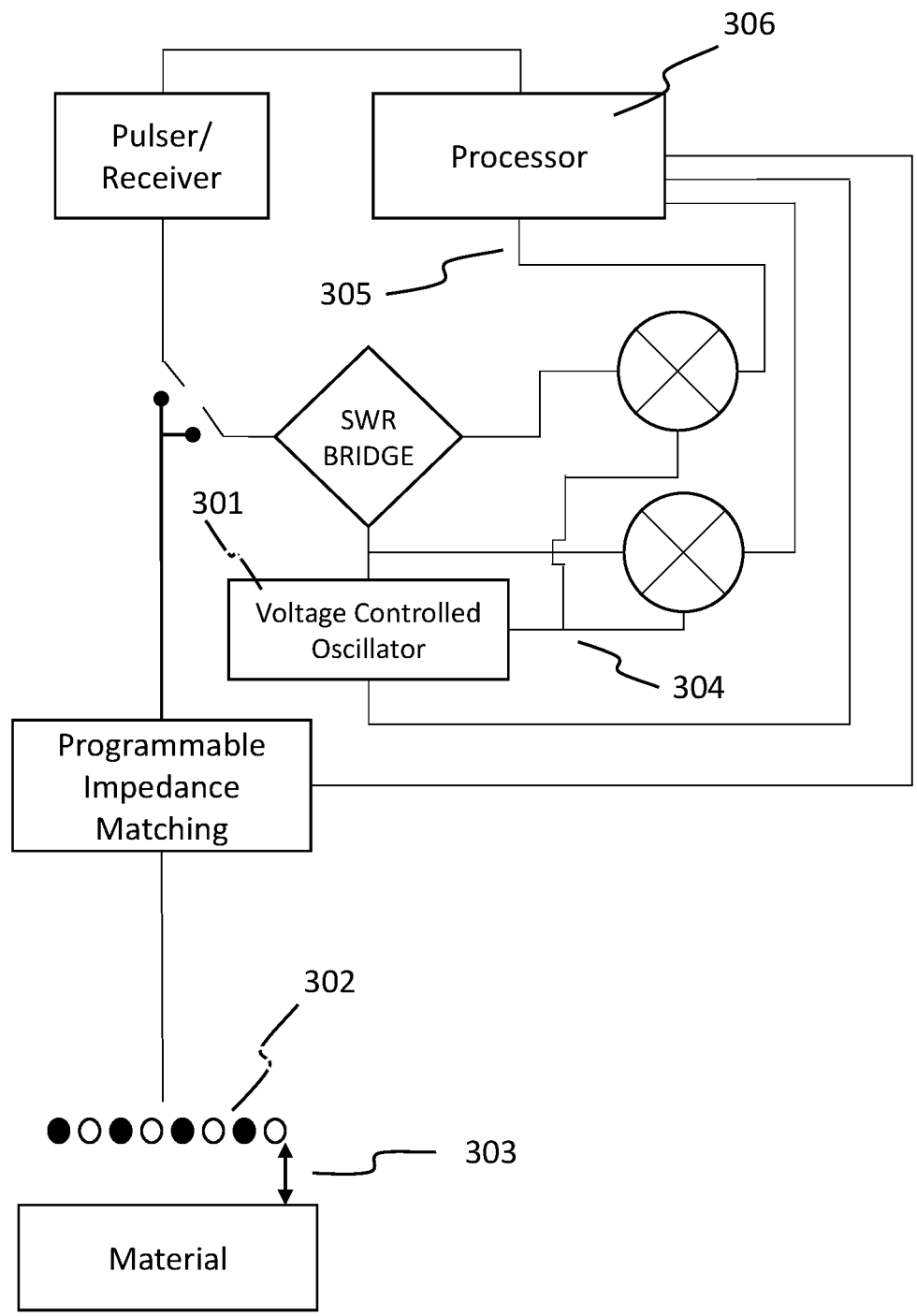
FIG. 3 is an illustration of Vector Network Analyzer circuit integrated within the EMAT electrical circuit.

FIG. 3 shows an illustration of a Vector Network Analyzer integrated with the EMAT electrical circuit. A single voltage-controlled oscillator 301 is used to produce a sweep frequency over time, which is supplied to the RF Coil 302 on top of the material at the appropriate lift-off 303. The return signal from the RF Coil is delayed and mixed with the original signal on device 304 to produce an intermediate frequency signal 305 that is digitized and the data manipulated by the processor 306 to measure the reflection coefficient or transmission coefficient of the EMAT electrical circuit.

Figure 4:
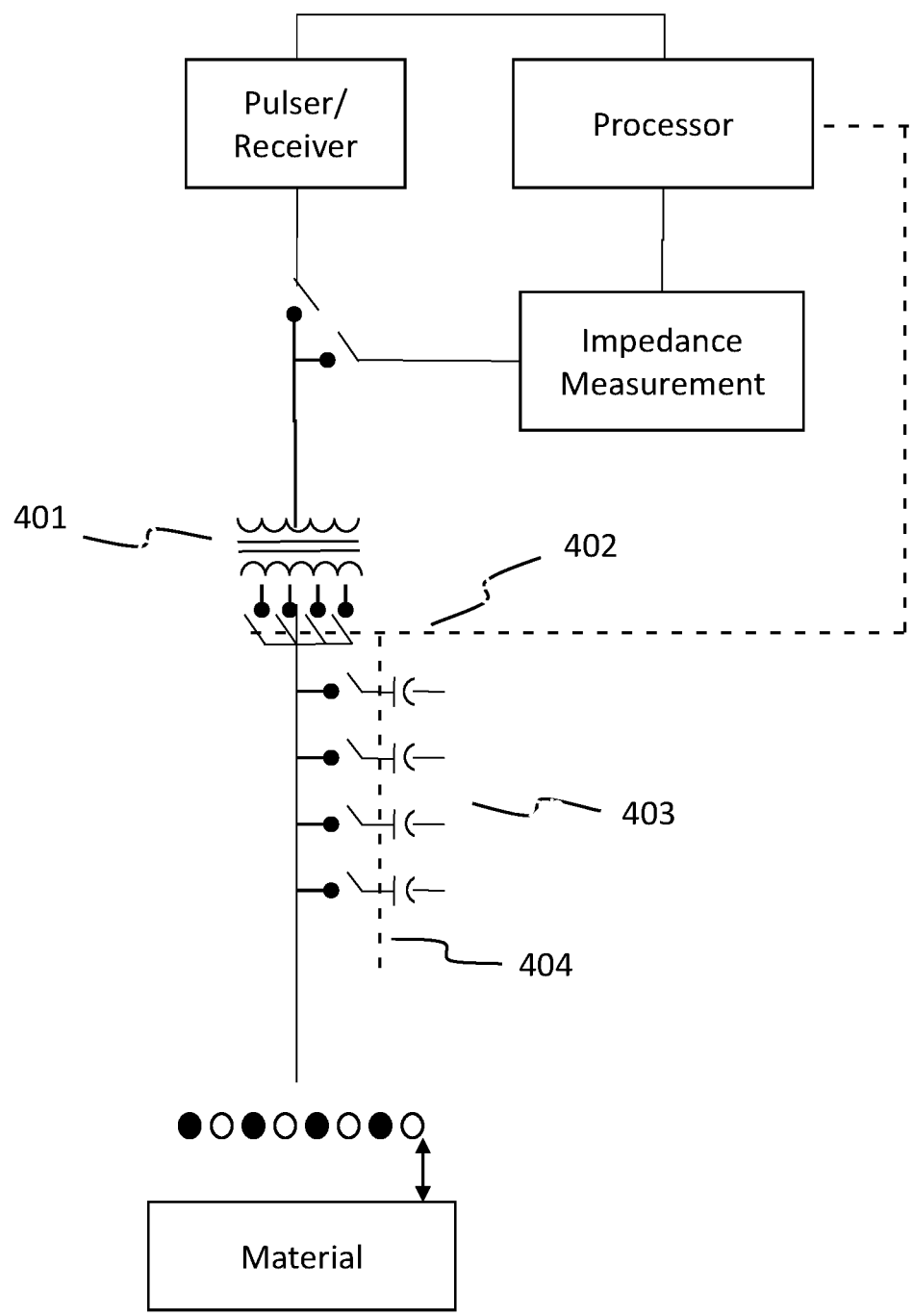
FIG. 4 is an illustration of the circuit that includes all the components and switches used to provide the appropriate impedance matching to the EMAT electrical circuit.

FIG. 4 shows an illustration of a programmable impedance matching circuit for EMAT. A multi-tap transformer 401 is used to step-up or step-down the overall impedance in discrete steps. The processor controls switches 402 that ties the selected transformer tap into the EMAT electrical circuit. The number of taps and switches is determined by the matching range and resolution desired. Capacitors 403 are used to cancel out the inductive reactance of the EMAT coil circuit. The processor controls switches 404 that selects one or more capacitors to achieve the desired total capacitance value. The number of capacitors and switches is determined by the matching range and resolution desired.

It should be understood, of course, that the foregoing relates to exemplary embodiments of the invention and that modifications may be made without departing from the spirit and scope of the invention as set forth in the following claims.

What is claimed is:

1. A system to measure and match the input impedance of at least one electromagnetic acoustic transducer (EMAT) electrical circuit composed of at least one RF coil cable and one RF coil located in the proximity of an electrically conductive material to be inspected, the system includes
   a processor connected to an impedance measurement circuit, and to a programmable impedance matching circuit, and to switches that can connect and disconnect the impedance measurement circuit to and from the system;
   an electronic circuit controlled by the processor and connected to the system to measure the input impedance of the EMAT electrical circuit and to relay the measured input impedance to the processor;
   a second electronic circuit controlled by said processor and connected between the impedance measurement circuit and the RF coil cable, the second electronic circuit includes impedance matching components to the EMAT electrical circuit,
   wherein the processor controls the second electronic circuit to selectively combine the impedance matching components in the second electronic circuit based on the measured input impedance relayed to the processor and a desired input impedance, so that the overall impedance of the EMAT electrical circuit can be adjusted to best match a desired impedance that would optimize performance of the EMAT which is based on a measured acoustic signal transmission coefficient or a measured acoustic signal reflection coefficient of the EMAT.

2. The system of claim 1, wherein the impedance measurement circuit is a Vector Network Analyzer.

3. The system of claim 1, wherein the impedance matching circuit includes capacitors, transformers, and switches.

4. The system of claim 1, wherein the same RF coil is used for transmission and reception.

5. The system of claim 1, wherein the RF coil comprises a first coil element used for transmission and a second coil element used for reception.

* * * * *